United States Patent [19]

Little

[11] Patent Number: 4,740,431
[45] Date of Patent: Apr. 26, 1988

[54] INTEGRATED SOLAR CELL AND BATTERY

[75] Inventor: Roger G. Little, Bedford, Mass.

[73] Assignee: Spice Corporation, Bedford, Mass.

[21] Appl. No.: 944,924

[22] Filed: Dec. 22, 1986

[51] Int. Cl.⁴ .................... H01M 12/00; H01L 25/02; H02N 6/00

[52] U.S. Cl. ........................................ 429/9; 136/244; 136/291

[58] Field of Search ...................... 429/9; 136/291, 244

[56] References Cited

U.S. PATENT DOCUMENTS 4,481,265 11/1985 Ezawa et al. ............................ 429/9

FOREIGN PATENT DOCUMENTS 0108492 5/1984 European Pat. Off. ............ 136/291
59-14681 1/1984 Japan ................................... 136/291
60-12780 1/1985 Japan ................................... 136/291

OTHER PUBLICATIONS

W. C. Maskell et al., *J. Electrochem. Soc.*, vol. 132, No. 7 (Jul. 1985), pp. 1602–1607.
J. M. Tarascan, *J. Electrochem. Soc.*, vol. 132, No. 9 (Sep. 1985), pp. 2089–2093.
W. Weppner, *J. Power Sources*, vol. 14, pp. 105–109 (1985).
R. T. Young et al, *Appl. Phys. Lett.*, vol. 28 (No. 8), pp. 628–630 (1981).

Primary Examiner—Aaron Weisstuch
Attorney, Agent, or Firm—Morse, Altman, Dacey & Benson

[57] ABSTRACT

An integrated solar cell and battery are described, together with a process of making the same. The integrated solar cell and battery are made by employing thin film deposition techniques on a substrate. Preferably first, a thin film solar cell is deposited on the substrate, as for example, by sputtering. This step is immediately followed by the deposition of a thin film battery, either onto the previously deposited thin film solar cell, or onto the back side of the substrate. The deposition process lends itself to automated production. The process includes the thin film deposition of series-connected arrays forming different types of integrated solar cells and batteries, depending on their electrical connections so as to vary the respective current and voltage characteristics of the resultant integrated units.

7 Claims, 3 Drawing Sheets

INTEGRATED SOLAR CELL AND BATTERY

BACKGROUND OF THE INVENTION

1. Field of the Invention

The present invention relates generally to integrated solar power generation and storage and, more particularly, to an integrated solar cell and battery made by thin film deposition techniques.

2. The Prior Art

Photovoltaics are widely used in electronic devices, such as, for example, pocket calculators and wristwatches. These electronic devices are powered by a photovoltaic cell (solar cell) and employ a separate, independent capacitor to store energy. Consequently, these electronic devices are bulky due to the presence of the storage capacitor. They are also expensive to make. For, unless the storage capacitor is made relatively large, its value as a load leveler will be limited. Hence, the length of time for which the device will operate in the dark is dependent on the size of its separate storage capacitor. Further, there are many electronic devices, such as emergency lights and radio transceivers, whose power requirements are too high to use such technology of a photovoltaic cell and separate storage capacitor.

A composite photovoltaic-storage battery device is disclosed in U.S. Pat. No. 4,481,265, issued Nov. 6, 1984. That device essentially discloses an insulating substrate having a plurality of layers forming a solar cell laminated onto one side thereof, and a plurality of layers, including a pair of electrodes and an interposed liquid electrolyte secured on the other side of the substrate. The operative use of the device of U.S. Pat. No. 4,481,265, when applied to a load, requires the use of three switches.

There is thus a present need to simplify the construction of such electronic devices, to improve their performance levels, and to include devices to be powered thereby whose operation by photovoltaics currently is impractical.

SUMMARY OF THE INVENTION

It is a principal object of the present invention to overcome the above disadvantages by providing an integrated photovoltaic cell (solar cell) and storage battery employing thin film deposition techniques and the process for making the same.

More specifically, it is an object of the present invention to provide an integrated solar cell and battery essentially comprising a substrate and a solar cell and a thin film battery, both deposited on the substrate by thin film deposition techniques, such as sputtering, vacuum evaporation, CVD, MOCVD, or the like. Preferably, the solar cell is a thin film amorphous solar cell. Preferably, the thin film battery includes a lithium anode, a solid electrolyte and a cathode, whose current-voltage characteristics are matched to the thin film solar cell. Preferably, a rectifying contact layer is interposed between the thin film solar cell and the thin film storage battery so as to prevent the storage battery from discharging through the thin film solar cell in the dark. The process includes the automated thin film deposition of series-connected arrays forming different types of integrated solar cells and batteries, depending on their electrical connections so as to vary, and thus adapt, the respective current-voltage characteristics of the resultant varied integrated units.

Other and further objects of the present invention will in part be obvious and will in part appear hereinafter.

The invention accordingly comprises the integrated solar cell and battery of the present disclosure, including the process of making it, its components, parts and their interrelationship, and steps, the scope of which will be indicated in the appended claims.

BRIEF DESCRIPTION OF THE DRAWINGS

For a fuller understanding of the nature and objects of the present invention, reference is made to the following detailed description, which is to be taken in connection with the accompanying drawings, wherein.

DETAILED DESCRIPTION OF THE PREFERRED EMBODIMENTS

In general, the illustrated embodiments of an integrated photovoltaic cell (more commonly known as solar cell) and storage battery are all made, according to the invention, by employing thin film deposition techniques on a suitable substrate. Such integrated, that is structurally combined as a single unit, solar cells and storage batteries find important uses in portable electronic devices as integrated power generation and storage modules. These integrated power generation and storage modules simplify the manufacture and construction of portable photovoltaic-powered devices, reduce their respective and heretofore bulky sizes, weights and appearances, improve their operational efficiencies, and allow their use in devices with high power requirements, including emergency lights, radio transceivers, certain types of portable computers, and "talking" watches and calculators for the visually handicapped, and the like.

Photovoltaics have now been in widespread use for some time in portable electronic devices, as for example, in pocket calculators and wristwatches. Their use has required, for the most part, the concurrent use of a separate and independent storage capacitor, connected in parallel with the photovoltaic cell (solar cell) to provide load leveling thereto. A recent composite photovoltaic-storage battery device, as per U.S. Pat. No. 4,481,265, employs an insulating substrate, having a plurality of laminated layers on one side as solar cell and a plurality of layers, including a liquid electrolyte, secured on the other side as a battery. Its operative use requires three switches.

As known, photovoltaics generate electricity when exposed to light, and only when so exposed. If the electronic device was intended to operate continuously however, i.e., even when in the dark, the device also had to be provided with a separate storage capacitor to collect and store the excess electricity produced by the solar cell when the same is exposed to light. Of necessity, the provision of such a separate storage capacitor of sufficient size to be of any relative value has added to the size, weight and appearance of the device, and also increased its cost and complexity of its manufacture. Further, in certain portable electronic devices, notably certain types of portable computers, emergency lights and radio transceivers, the power requirements are so high as to make it impractical to employ such technology, i.e, the size and weight of both the photovoltaic cell and separate storage cell make economically prohibitive their widespread use in such high power devices.

The present invention employs thin film technology to provide an integrated solar cell and storage battery structurally combined as a single unit and produced in a single continuous process, which process lends itself to large-scale, hence inexpensive, automated production.

Figure 1:
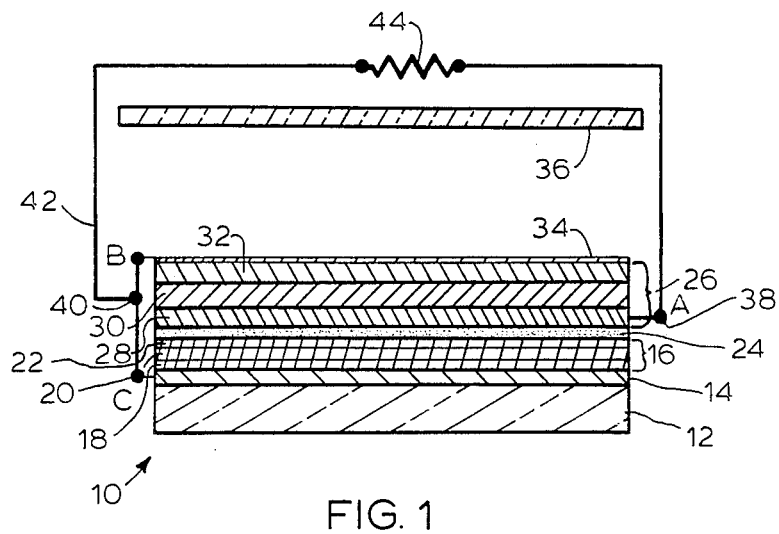
FIG. 1 is a schematic longitudinal section, on an enlarged scale, of an integrated solar cell and storage battery formed as a unit on a substrate according to the invention.

In FIG. 1, there is shown, in schematic longitudinal section and on an enlarged scale, an integrated thin film solar cell and storage battery 10, formed as a single unit by thin film deposition techniques. Thin film technology is now well developed and well known by those skilled in the art. Spire Corporation, the assignee of this application, has long been a pioneer in the development of thin film technology, particularly as applied to solar cell technology, note some of the U.S. Letters Patents that have been granted and assigned to it: U.S. Pat. No. 4,179,324, involving a process of fabricating thin film and glass sheet laminate; U.S. Pat. No. 4,486,265, involving a process of making thin film materials for high efficiency solar cells; and U.S. Pat. No. 4,443,488, involving a plasma ion deposition process of large-grain thin semiconductor films on low-cost amorphous substrates.

In recent years, thin film technology also has been applied to the making of thin film batteries, with varying degrees of success. This effort has been motivated by a continuous need for light-weight high energy storage devices, specifically secondary rechargeable batteries. The effort led to the discovery of several promising thin film battery systems based on lithium. It has been noted that thin film batteries using lithium or its alloys as the anode exhibit an advantageously high power-to-weight ratio. Until recently, lithium based thin film batteries could only be used as primary disposable batteries since they were not rechargeable. These lithium based batteries could not be charged because during their charging, dendrites were forming on their anodes. Dendrite regrowth of the lithium on the anode, in turn, short circuited the battery. Recent advances in the field have led to the suppression of dendrite formation by the use of certain lithium alloys in lieu of pure lithium for the anode or by employing an intercalation compound as the anode. See W. C. Maskell and J. R. Owen, "Cycling Behavior of Thin-film Lithium-aluminum (LiAl) Electrodes with Liquid and Solid Electrolytes," *J. Electrochem. Soc.*, 132(7), 1602 (1985), and J. M. Tarascon, "Molybdenum Selenide ($Mo_6Se_6$): A new Solid-State Electrode for Secondary Lithium Batteries," *J. Electrochem. Soc.* 132(9), 2089 (1985).

By employing lithium alloys or intercalation compounds in lieu of pure lithium for the anode however, a part of the anode has been rendered electrically inactive. As a consequence, the energy storage density of the thin film battery also has been reduced. As known, the use of lithium as a material for thin film batteries is of particular advantage because lithium forms a very small (about 60 pm radius) and highly mobile ion.

The integrated thin film solar cell and storage battery 10 of FIG. 1 is made by thin film deposition techniques, such as sputtering, vacuum evaporation, CVD and MOCVD, with sputtering being the preferred method. A transparent non-conducting substrate 12, such as glass, is used as the starting material. The various layers forming the solar cell and the thin film battery are then successively applied to the substrate 12 to form the combined, single, unitary structure. First, a transparent conductive layer 14, preferably formed of tin oxide, is sputtered or otherwise deposited onto the substrate 12. This conductive layer 14 will serve as the front contact for the resultant combined unit. Next, a photovoltaic cell 16 (i.e. solar cell) is deposited on the conductive layer 14. The photovoltaic cell 16 itself is comprised of three layers, deposited seriatim, namely: a p-type front thin film semiconductor layer 18 formed immediately adjacent the conductive layer 14, an intrinsic thin film semiconductor layer 20, and an n-type back thin film semiconductor layer 22. Preferably, the thin film semiconductor layers 18, 20 and 22 are all formed of amorphous silicon (a—Si). These layers 18, 20 and 22 also can be formed of any other suitable material, including conventional crystalline silicon, or the like.

On the back of the photovoltaic cell 16, that is on top of the n-type back thin film semiconductor layer 22, a rectifying contact layer 24 preferably is deposited to serve as an electrical isolation between the solar cell 16 and the thin film battery. The rectifying contact layer 24 preferably is formed of a metal such as gold, which makes a Schottky barrier to the n-type semiconductor layer 22. The significance of this rectifying contact layer 24 will be more fully discussed below with reference to FIGS. 2 and 3. A thin film battery 26 is then deposited on top of the rectifying contact layer 24. The thin film battery 26 also is composed of three layers, successively deposited, namely: an anode 28, preferably formed of pure lithium, a solid electrolyte 30, formed of glass, preferably a lithium sulfide-based glass, and a cathode 32, preferably formed of titanium disulfide ($TiS_2$). Other thin film materials also can be employed and will readily suggest themselves to those skilled in the art. For example, for the anode 28, one may choose a lithium-aluminum alloy; for the solid electrolyte 30, one can select polyethylene oxide containing a lithium salt; and for the cathode 32, one can use molybdenum selenide ($Mo_6Se_6$). A back contact metal layer 34, preferably formed of aluminum, is then deposited on top of the thin film battery 26, and in electrical contact with its layer of cathode 32. Preferably, an encapsulating layer 36, formed of glass or like suitable material, is applied over the back contact layer 34 and, cooperating with the transparent glass substrate 12, serves to encapsulate the integrated solar cell and battery 10 so as to protect the same from the adverse effects of the elements, mostly air and moisture. Such encapsulation can be effected, for example, as described in the U.S. Pat. No. 4,509,248, entitled "Encapsulation of Solar Cells," assigned to a common assignee, or by an adaptation of the method disclosed in my prior U.S. Pat. No. 4,450,033, entitled "Front Surface Metallization and Encapsulation of Solar Cells."

A pair of external contacts 38 (A) and 40 (connection between B and C) are intended to protrude from the encapsulated integrated solar cell and battery 10 to provide the connection, in a two-wire circuit 42 and without any switch, for a load 44, which it is intended to power. As will be observed, one external contact 38 is coupled to the anode 28 of the thin film battery 26. The other external contact 40 is, on the other hand, coupled to both the back contact layer 34 and the front transparent conductive layer 14. This two-wire circuit 42 is made feasible by the interposition of the rectifying contact layer 24 between the solar cell 16 and the thin film battery 26. As stated, this rectifying contact layer 24 prevents the thin film battery 26 from discharging through the solar cell 16 when the integrated solar cell and battery 10 is in the dark, i.e., not exposed to charging light.

Figure 2:
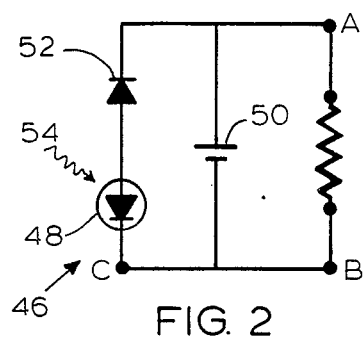
FIGS. 2 and 3 are equivalent circuit diagrams useful in understanding the principles of the invention.
Figure 3:
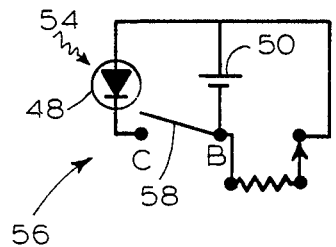

FIGS. 2 and 3 illustrate the above principle. FIG. 2 illustrates a circuit 46, which circuit 46 is an equivalent circuit for the integrated solar cell and battery 10 shown in and described with reference to FIG. 1. In the equivalent circuit 46, the solar cell 16 of the integrated solar cell and battery 10 is indicated by a photovoltaic diode 48 and the thin film battery 26 by a capacitor 50 in parallel therewith. The rectifying contact layer 24 is shown as a reverse diode 52, which prevents the capacitor 50 from discharging via a non-charging photovoltaic diode 48 when the same is not illuminated by light 54. In contrast, FIG. 3 illustrates a circuit 56, which is a three-wire circuit, necessitated by the absence of the reverse diode 52, signifying the absence of the rectifying contact layer 24 in the integrated solar cell and battery 10 of FIG. 1. Due to this absence, an external switch 58 is now required to disconnect the photovoltaic diode 48 from the storage capacitor 50 in the dark. The switch 58 can be operated automatically, controlled either by the voltage from the photovoltaic cell or by a light sensor, not shown. The switch 58 can be replaced with an external diode.

Figure 4:
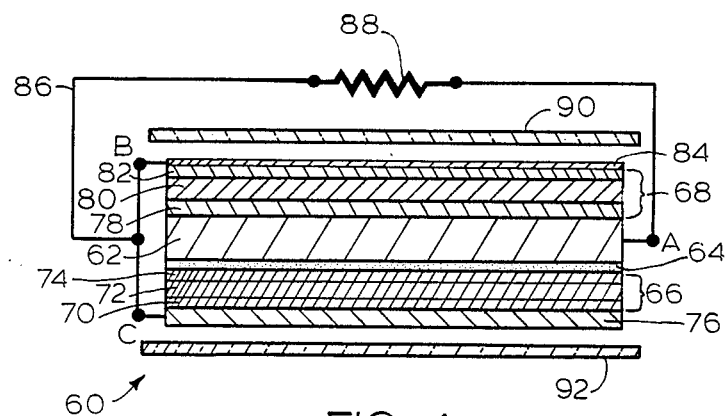
FIG. 4 is a view similar to FIG. 1 but showing a different embodiment of an integrated solar cell and storage battery according to the invention.

FIG. 4 is a view similar to FIG. 1 but illustrates a different embodiment of an integrated solar cell and battery 60 according to the invention. In this structure, in lieu of the non-conducting and transparent substrate 12 of FIG. 1, a conducting and non-transparent substrate 62 is used. The operative parts of the structure, i.e., the solar cell and the battery, are respectively deposited, by thin film deposition techniques, on the conducting non-transparent substrate 62 on both sides thereof.

Specifically, in the structure of FIG. 4, a rectifying contact layer 64 again is used to separate electrically a photovoltaic cell 66 from a thin film battery 68, since the separating substrate 62 is now a conducting one. the rectifying contact layer 64 can comprise gold or titanium nitride. Both the photovoltaic cell 66 and the battery 68 are formed of their three respective layers, namely a thin film p-type front semiconductor layer 70, a thin film semiconductor intrinsic layer 72, and a thin film n-type back semiconductor layer 74 for the photovoltaic cell 66. A transparent conducting layer 76 is, in turn, deposited on the p-type front layer 70, serving as the front contact for the integrated solar cell and battery 60. The thin film battery 68 also is formed of an anode 78, a solid electrolyte 80, and a cathode 82, but this time on the other side of the substrate 62. A rear contact metal layer 84 is deposited on the cathode 84. The materials for the respective deposited layers are the same as described with reference to the structure of FIG. 1. With the front 76 and back 84 contact layers here also connected, this structure also is a two-wire circuit 86 structure without a switch, servicing a load 88, which may be a watch, a pocket calculator or the like. Since both sides of the resultant integrated solar cell and battery 60 now feature conducting layers, two encapsulating layers 90 and 92 are required to encapsulate the structure and thus to protect the same from air and moisture. The integrated solar cell and battery 60 is capable of generating a current of about 30 mA per $cm^2$ at about 0.5 volts in direct sunlight and is capable of storing about one mA-hour per $cm^2$.

Figure 5:
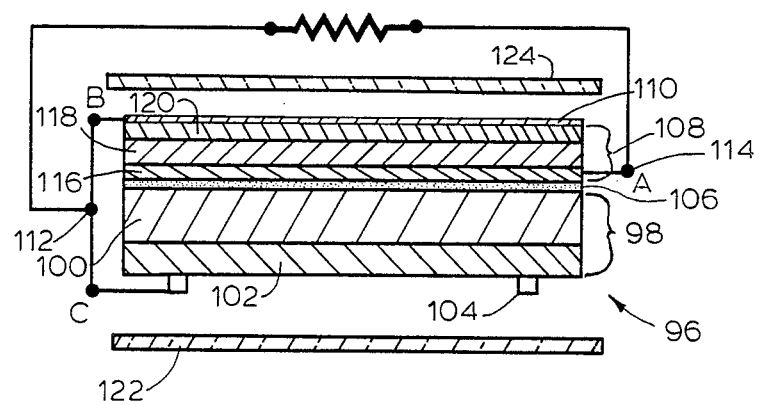
FIG. 5 is a view similar to FIG. 4 but showing a further embodiment of an integrated solar cell and storage battery according to the invention.

In FIG. 5 is illustrated another embodiment of an integrated solar cell and battery 96 according to the invention. The structure thereof is similar to the one shown in and described with reference to FIG. 4, except that the thin film semiconductor solar cell 66 and the conducting non-transparent substrate 62 of the former are herein replaced by a bulk-type photovoltaic cell 98 comprising an n-type bulk semiconductor substrate 100 and a p-type doped semiconductor layer 102. The layer 102 is formed of implanted, diffused or deposited layers forming either a single junction photovoltaic cell or a multijunction tandem cell. A metal front contact grid 104 completes one side of the structure. On the other side of the n-type bulk semiconductor substrate 100, first is deposited a rectifying contact layer 106, followed by a thin film battery 108 and a back contact layer 110. Again and as in the structure of FIG. 4, the front contact 104 and the back contact 110 are connected together to form one external wire contact 112 in a two-wire system. The second external wire contact 114 is coupled to the anode 116 of the battery 108, which also includes a solid electrolyte layer 118, and a cathode 120. Two encapsulating layers 122 and 124 serve to protect the structure from air and moisture.

Figure 6:
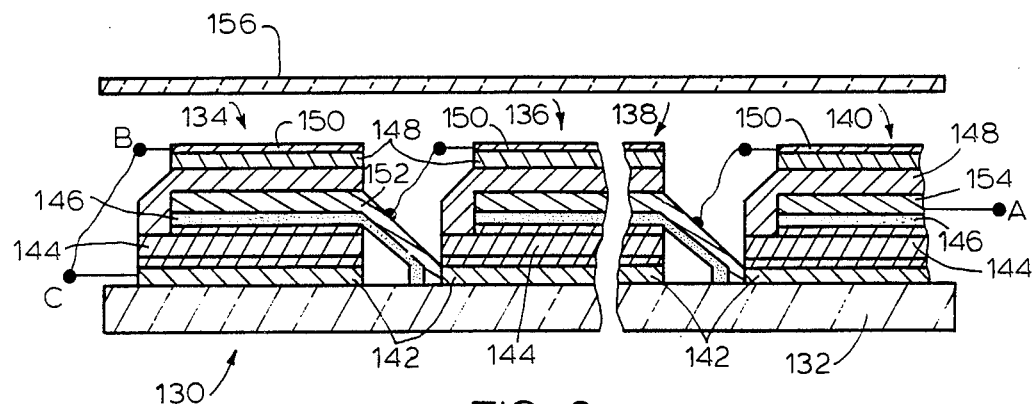
FIGS. 6–8 illustrate different embodiments of series-connected arrays, showing different types of integrated solar cells and batteries, with varying current-voltage characteristics, respectively.
Figure 7:
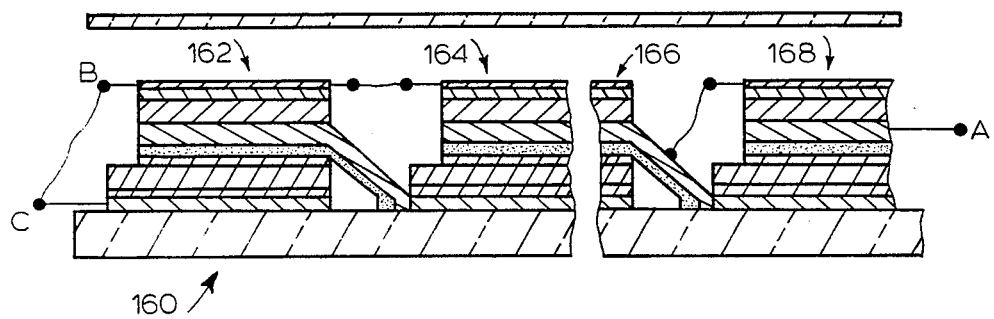
Figure 8:
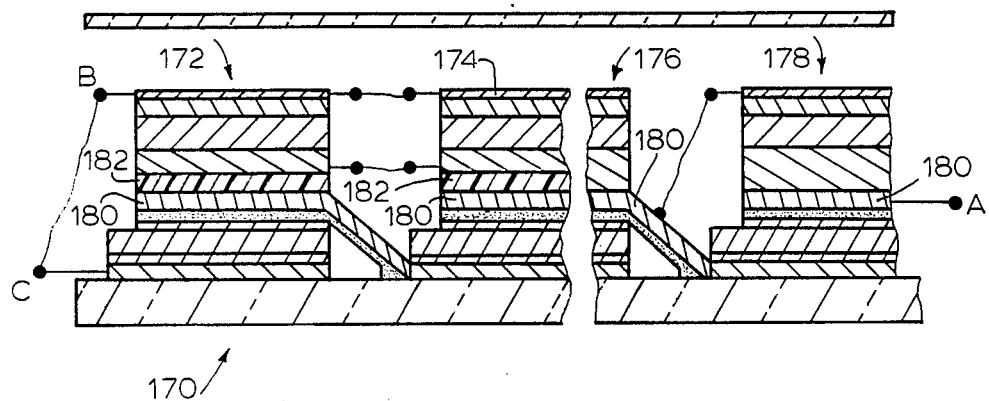

In FIGS. 6–8, there are shown different embodiments of series-connected arrays, illustrating different types of integrated solar cells and batteries, each with its own unique current-voltage characteristics, depending on end use. Furthermore, each of these different embodiments of series-connected arrays lends itself to, and preferably is made by, an automated process involving thin film deposition techniques.

The embodiment of a series-connected array 130 shown in FIG. 6 is similar in structure to the integrated solar cell and battery 10 shown in and described with reference to FIG.1, except that it is composed of a plurality 134, 136, 138 and 140 of such individual integrated solar cell and battery assemblies connected in series. The array 130 is deposited on a single transparent non-conducting substrate 132. Each of the plurality of integrated assemblies 134, 136, 138 and 140, is formed with a conductive layer 142, a solar cell 144 comprising of the three respective layers, just like the solar cell 16 in FIG. 1, a rectifying contact layer 146, and a thereon deposited thin film battery 148, also comprised of the respective anode, cathode and the solid electrolyte sandwiched therebetween. A back contact layer 150 completes each assembly 134, 136, 138 and 140. It will be observed that the anode 152 of the first assembly 134 is connected to both the front conductive layer 142 as well as to the back contact layer 150 of the adjacent second assembly 136, and so on down the array 130 to its last assembly 140. The external connections to the array 130 are made, just like in FIG. 1, to the connection of the front contact 142 and the back contact 150 of the first assembly 134 and to the anode 154 of the last assembly 140. It will be observed that the front contacts 142 of the adjacent assemblies 134, 136, 138 and 140 are separated from each other.

With the electrical connections between the assemblies 134, 136, 138 and 140 effected, the array 130 also is preferably enclosed by an encapsulating layer 156 to protect the array 130 from the elements, particularly air and moisture.

In the embodiment of a series-connected array 160 shown in FIG. 7, the respective structures of the plurality of integrated solar cell and battery sub-assemblies 162, 164, 166 and 168 are identical to the structures of the assemblies 134, 136, 138 and 140 of the array 130 of FIG. 6. The difference lies in their electrical connections. While the last assembly 168 herein is connected to the penultimate assembly 166 in the same way and the external connections also are the same as in the array 130 of FIG. 6, the first and the in-between sub-assemblies 162 and 164 are connected in such a way that a plurality of solar cells will now charge what in effect is now but one large thin film battery. Specifically, the back contact layers of the assemblies 162, 164 and 166 are connected to one another, but the anodes of the assemblies 164 and 166, and any further assemblies therebetween, are not connected to each other. And, the back contact of the final assembly 168 is connected to the anode of the penultimate assembly 166.

In the final illustrated embodiment of a series-connected array 170 shown in FIG. 8, the thin film batteries of the respective integrated sub-assemblies 172, 174 and 176 are connected in parallel, while their corresponding solar cells are connected in series. A separate conducting layer 180 in each sub-assembly 172, 174 and 176 is used to connect the respective solar cells in series, in lieu of the anodes, as in the embodiment of FIG. 7. These respective conducting layers 180 are, in turn, separated from the anodes by insulating layers 182 in all except the penultimate sub-assembly 176. The final sub-assembly 178 is now connected from its back contact to the conducting layer 180 of the penultimate assembly 176. And the external contact (A) is now connected to the conducting layer 180, rather than to the anode of the last sub-assembly 168, as in FIG. 7.

Thus it has been shown and described an integrated solar cell and battery 10 and a process for making the same, which integrated solar cell and battery 10 is designed to power electronic devices, including calculators, wristwatches, emergency lights, radio transceivers and the like in an efficient manner, and which integrated solar cell and battery 10 thus satifies the objects and advantage set forth above.

Since certain changes may be made in the present disclosure without departing from the scope of the present invention, it is intended that all matter described in the foregoing specification or shown in the accompanying drawings, be interpreted in an illustrative and not in a limiting sense.

What is claimed is:

1. An integrated solar cell and battery comprising:
   (a) a substrate; and
   (b) a solar cell and a thin film battery including a solid electrolyte, deposited by thin film deposition techniques on said substrate;
   (c) said substrate and said solar cell together comprising a bulk type solar cell.

2. The integrated solar cell and battery of claim 1 wherein said thin film deposition techniques are chosen from the following: sputtering, vacuum evaporation, CVD and MOCVD.

3. The integrated solar cell and battery of claim 1 wherein a rectifying contact layer is interposed between said bulk type solar cell and said thin film battery.

4. An integrated solar cell and battery comprising:
   (a) a substrate;
   (b) a plurality of solar cells deposited on said substrate;
   (c) a plurality of thin film batteries respectively deposited on said plurality of solar cells;
   (d) a plurality of connecting elements respectively connecting said plurality of solar cells in series and said plurality of thin film batteries in parallel so as to form a series-parallel connected array; and
   (e) a plurality of rectifying contact layers electronically shielding said plurality of thin film batteries from discharging through said plurality of solar cells when in the dark.

5. An integrated solar cell and battery comprising:
   (a) a non-transparent conducting substrate;
   (b) a thin film battery including a solid electrolyte deposited by thin film deposition techniques directly on one side of said substrate;
   (c) a rectifying contact layer deposited on a second side of said substrate;
   (d) a solar cell deposited on said rectifying contact layer;
   (e) a rear contact metal layer deposited on said thin film battery; and
   (f) a transparent conducting layer deposited on said solar cell.

6. The integrated solar cell and battery of claim 5 further including electrical contacts connecting said transparent conducting layer with said rear contact metal layer to form one external wire connection and another of said electrical contacts connected to said non-transparent conducting substrate to form the second external wire connection of said integrated solar cell and battery.

7. The integrated solar cell and battery of claim 5 further including an encapsulating layer, exposing only said two external wire connections.

* * * * *